United States Patent
Dickerson et al.

(10) Patent No.: US 8,487,280 B2
(45) Date of Patent: Jul. 16, 2013

(54) MODULATING IMPLANTATION FOR IMPROVED WORKPIECE SPLITTING

(75) Inventors: Gary E. Dickerson, Gloucester, MA (US); Julian G. Blake, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 162 days.

(21) Appl. No.: 12/909,225

(22) Filed: Oct. 21, 2010

(65) Prior Publication Data

US 2012/0097868 A1 Apr. 26, 2012

(51) Int. Cl.
*G21K 5/00* (2006.01)

(52) U.S. Cl.
USPC ............... 250/492.3; 250/492.1; 250/492.2; 438/369; 438/372; 438/373; 438/473; 438/480; 438/506; 438/514; 438/519; 438/527; 438/659

(58) Field of Classification Search
USPC .... 250/492.1, 492.2, 492.21, 492.3; 438/369, 438/372, 373, 473, 480, 506, 514, 519, 527, 438/659
See application file for complete search history.

(56) References Cited

U.S. PATENT DOCUMENTS

| | | | |
|---|---|---|---|
| 5,374,564 A | 12/1994 | Bruel | |
| 5,877,070 A | 3/1999 | Goesele et al. | |
| 6,033,974 A | 3/2000 | Henley et al. | |
| 6,055,460 A | 4/2000 | Shopbell | |
| 6,184,111 B1 | 2/2001 | Henley et al. | |
| 6,290,804 B1 | 9/2001 | Henley et al. | |
| 6,291,313 B1 | 9/2001 | Henley et al. | |
| 6,291,326 B1 | 9/2001 | Henley et al. | |
| 6,486,041 B2 | 11/2002 | Henley et al. | |
| 6,500,732 B1 | 12/2002 | Henley et al. | |
| 6,548,382 B1 | 4/2003 | Henley et al. | |
| 6,790,747 B2 | 9/2004 | Henley et al. | |
| 7,544,957 B2 | 6/2009 | Walther et al. | |
| 7,816,225 B2 | 10/2010 | Cherekdjian et al. | |
| 2006/0060943 A1 | 3/2006 | Ben Mohamed et al. | |
| 2006/0240651 A1 | 10/2006 | Renau et al. | |
| 2008/0067434 A1* | 3/2008 | Walther et al. | 250/492.21 |
| 2009/0209084 A1* | 8/2009 | Nunan et al. | 438/458 |
| 2010/0112825 A1 | 5/2010 | Cherekdjian et al. | |
| 2011/0233431 A1* | 9/2011 | Wan et al. | 250/492.21 |

FOREIGN PATENT DOCUMENTS

WO  2006032948 A1  3/2006

\* cited by examiner

*Primary Examiner* — Nicole Ippolito

(57) ABSTRACT

A first species is implanted into an entire surface of a workpiece and helium is implanted into this entire surface with a non-uniform dose. The first species may be, for example, hydrogen, helium, or nitrogen. The helium has a higher dose at a portion of a periphery of the workpiece. When the workpiece is split, this split is initiated at the periphery with the higher dose. The non-uniform dose may be formed by altering a scan speed of the workpiece or an ion beam current of the helium. In one instance, the non-uniform dose of the helium is larger than a uniform dose of the hydrogen.

17 Claims, 5 Drawing Sheets

MODULATING IMPLANTATION FOR IMPROVED WORKPIECE SPLITTING

FIELD

This invention relates to splitting a workpiece, and, more particularly, to a process that forms microbubbles that are used to split a workpiece.

BACKGROUND

An ion implanter includes an ion source for converting a gas or a solid material into a well-defined ion beam. The ion beam typically is mass analyzed to eliminate undesired ion species, accelerated to a desired energy, and implanted into a target. The ion beam may be distributed over the target area by electrostatic or magnetic beam scanning, by target movement, or by a combination of beam scanning and target movement. The ion beam may be a spot beam or a ribbon beam having a long dimension and a short dimension.

Implantation of an ion species may allow a workpiece to be split. The species forms microbubbles in the workpiece material. These microbubbles are pockets of a gas or regions of an implanted species below the surface of the workpiece that may be arranged to form a weakened or porous layer in the workpiece. A later process, such as a thermal, chemical, or mechanical process, is used to split the workpiece into two layers along the weakened layer or porous layer.

FIG. 1 is an embodiment of an implanted workpiece with a layer of microbubbles. A species 300, which may be, for example, hydrogen, is implanted into the workpiece 206. In some embodiments, hydrogen may be implanted at approximately 6E16 $cm^{-2}$ to produce a layer of microbubbles 301 below the surface of the workpiece 206. The workpiece 206 is later split along this layer of microbubbles 301. In other embodiments, helium, oxygen, nitrogen, other rare or noble gases, or a combination of gases are used to form the layer of microbubbles 301. This may be performed in one implant or a series of implants. Greater implant energy of the species 300 generally will result in a greater implant depth of microbubbles 301. Greater implant dose of the species 300 generally will result in a greater concentration of the species 300 that form the microbubbles 301.

Previous methods have implanted hydrogen or a combination of hydrogen and helium to split a workpiece. However, a uniform dose of hydrogen or hydrogen and helium causes random split initiation. Using a thermal splitting process with a uniform dose means that there is no control over where the split begins. This may cause damage to the workpiece depending on its orientation in a thermal processing unit. A uniform dose also may make mechanical splitting methods more difficult or time-consuming. Furthermore, the implanted dose may not be optimized to enable propagation of the split. Accordingly, there is a need in the art for an improved process to implant a workpiece before splitting.

SUMMARY

According to a first aspect of the invention, a method of implanting a workpiece is provided. The method comprises implanting a first species into an entire surface of the workpiece. Helium also is implanted into the entire surface of the workpiece. The helium has a non-uniform dose such that the helium has a higher dose at a portion of the periphery of the workpiece. A split is initiated at the edge with the higher dose.

According to a second aspect of the invention, a method of implanting a workpiece is provided. The method comprises implanting a uniform dose of hydrogen into the workpiece. A non-uniform dose of helium is implanted into the workpiece by altering at least one of a scan speed of the workpiece and an ion beam current of the helium. The helium has a higher dose at a portion of a periphery of the workpiece. A split is initiated at the edge with the higher dose.

According to a third aspect of the invention, a method of implanting a workpiece is provided. The method comprises implanting a uniform dose of hydrogen into the workpiece. A non-uniform dose of helium is implanted into the workpiece by altering at least one of a scan speed of the workpiece and an ion beam current of the helium. The helium has a higher dose at a portion of a periphery of the workpiece. The non-uniform dose of the helium is larger than the uniform dose of the hydrogen. A split is initiated at the edge with the higher dose.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
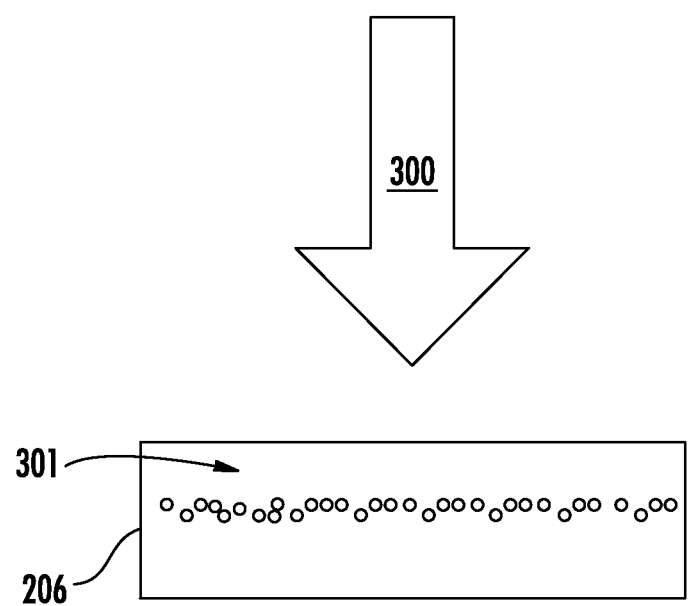
FIG. 1 is an embodiment of an implanted workpiece with a layer of microbubbles.
Figure 2:
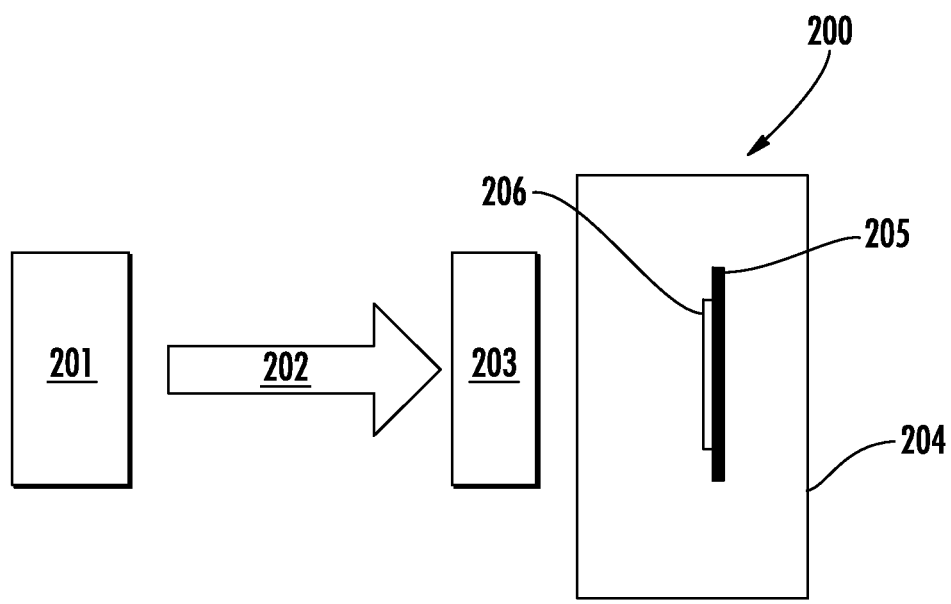
FIG. 2 is a simplified block diagram of a beam-line ion implanter.

FIG. 2 is a simplified block diagram of a beam-line ion implanter. Those skilled in the art will recognize that the beam-line ion implanter 200 is only one of many examples of differing beam-line ion implanters. In general, the beam-line ion implanter 200 includes an ion source 201 to generate ions that are extracted to form an ion beam 202, which may be, for example, a ribbon beam or a spot beam. The ion beam 202 may be mass analyzed and converted from a diverging ion beam to a ribbon ion beam with substantially parallel ion trajectories in one instance. The beam-line ion implanter 200 may further include an acceleration or deceleration unit 203 in some embodiments.

An end station 204 supports one or more workpieces, such as the workpiece 206, in the path of the ion beam 202 such that ions of the desired species are implanted into workpiece 206. In one instance, the workpiece 206 may be a semiconductor wafer having a disk shape, such as, in one embodiment, a 300 mm diameter silicon wafer. However, the workpiece 206 is not limited to a silicon wafer. The workpiece 206 also could be, for example, a flat panel, solar, or polymer workpiece. The end station 204 may include a platen 205 to support the workpiece 206. The end station 204 also may include a scanner (not shown) for moving the workpiece 206 perpendicular to the long dimension of the ion beam 202 cross-section, thereby distributing ions over the entire surface of workpiece 206.

The beam-line ion implanter 200 may include additional components known to those skilled in the art such as automated workpiece handling equipment, Faraday sensors, or an electron flood gun. It will be understood to those skilled in the art that the entire path traversed by the ion beam is evacuated during ion implantation. The beam-line ion implanter 200 may incorporate hot or cold implantation of ions in some embodiments.

One skilled in the art will recognize other systems and processes involved in semiconductor manufacturing, other systems and processes involved in plasma treatment, or other systems and processes that use accelerated ions that may perform the process described herein. Some examples of this, for example, are a plasma doping tool, an ion shower, or a plasma immersion tool. Other semiconductor processing equipment known to those skilled in the art that can accelerate species and implant species into a workpiece also may be used. Thus, this process is not limited solely to beam-line ion implanters.

FIGS. 3A-E are cross-sectional views of an embodiment of splitting. Embodiments of this process may be applied to, for example, silicon-on-insulator (SOI), 3D integrated circuit (IC), or stacked chip configurations. This process also may be applicable to the fabrication of workpieces that are used in, for example, flat panels, thin films, solar cells, light emitting diodes (LEDs), other thin metal sheets, or other devices. The workpiece that is split using this process may be, for example, Si, SiC, GaN, GaP, GaAs, polysilicon, Ge, quartz, or other materials.

In fabricating a split workpiece, a workpiece 206 is provided (A). The workpiece 206 may be referred to as a donor workpiece. A first species 300, such as hydrogen, helium, or nitrogen, for example, is implanted (B) into the workpiece 206 to form a layer of microbubbles 301 (as illustrated by the dotted line in FIG. 3B). Forming the microbubbles 301 with the species 300 may include creating damage sites where the microbubbles 301 grow either during implant or a later processing step. The layer of microbubbles 301 are a distance below the surface of the workpiece 206. The layer of microbubbles 301 initiates a defect plane at the desired depth, which depends on the implant energy. The first species 300 is implanted in a uniform dose in one particular embodiment.

Figure 3:
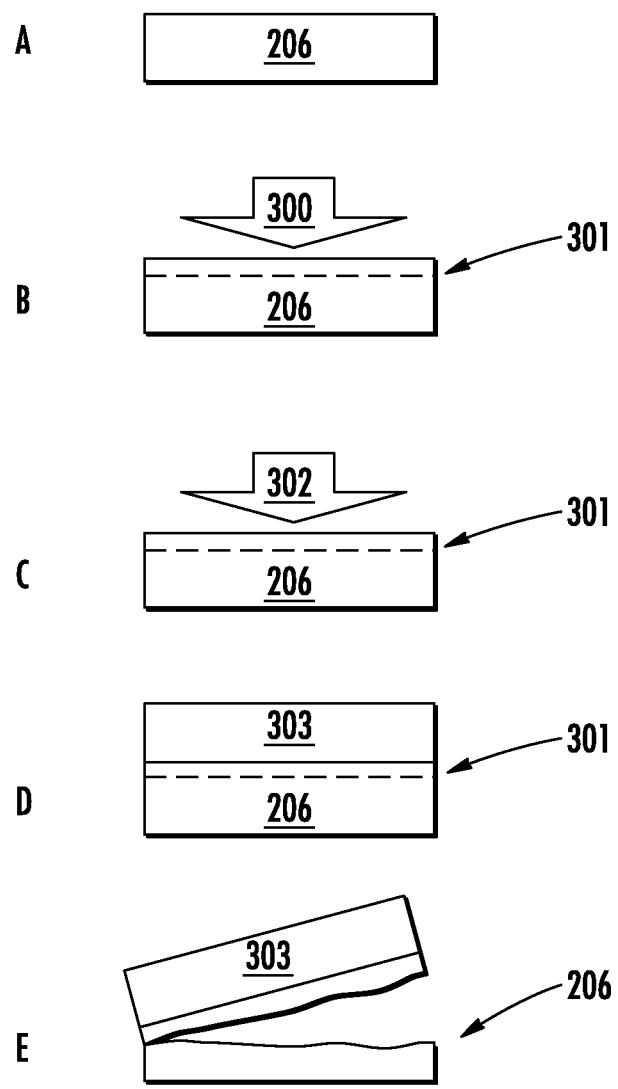
FIGS. 3A-E are cross-sectional views of an embodiment of splitting.

A second species 302, such as helium, for example, is implanted (C) into the workpiece 206. Of course, other species known to this skilled in the art also may be used for the second species 302. While implanting the second species 302 is illustrated in FIG. 3 after the first species 300 is implanted, the second species 302 may be implanted prior to the first species 300. The first species 300 and second species 302 may be implanted to an approximately similar depth in one particular embodiment, such as the layer of microbubbles 301 in FIG. 3. The first species 300 and second species 302 may be implanted into the same workpiece 206 in the implanter without breaking vacuum, may be implanted in separate implanters, or may be implanted using a batch sequence in the same implanter. If the first species 300 and second species 302 are implanted without breaking vacuum, the implanter may be re-turned between the implants. Implanting without breaking vacuum may permit tuning a tighter ion beam to make a more precise dose adjustment. Thus, the ion beam may be focused in one dimension, such as the vertical dimension. Re-tuning may take several minutes, so re-tuning only between implanting the first species 300 and second species 302 may save time compared to re-turning the ion beam one or more times for each workpiece 206.

Use of the first species 300 and second species 302 improves splitting. In one particular embodiment, the first species 300 is hydrogen and the second species 302 is helium. In one potential mechanism, the hydrogen forms the microbubbles and bonds with the dangling silicon bonds in the workpiece 206. The helium then fills the interior of the microbubbles. Of course, other mechanisms are possible and the embodiments disclosed herein are not limited merely to this disclosed mechanism.

The second species 302 has a non-uniform dose. This is accomplished by, for example, altering a scan speed of the workpiece 206 or an ion beam current of the second species 302. Thus, the dose of the second species 302 is not the same across the entire implanted surface of the workpiece 206.

In one embodiment, the total dose of the first species 300 and second species 302 is approximately $1E16$ cm$^{-2}$ to approximately $2E16$ cm$^{-2}$. The second species 302 has a higher dose than the first species 300. The second species 302 may have a non-uniform dose that varies by approximately 20% across the workpiece 206.

The workpiece 206 is bonded to a handle 303 (D). This bonding to the handle 303 may occur before implanting the first species 300 or second species 302 in other embodiments. The implant energy of the first species 300 or second species 302 may be adjusted to implant through the handle 303 or the implants may be performed through the side of the workpiece 206 opposite the handle 303 in these embodiments.

During a thermal, mechanical, ultrasound, or chemical process, the workpiece 206 fractures or splits along the layer of microbubbles 301 (E) with some of the workpiece 206 attached to the handle 303. In one particular embodiment, a fluid force is used to mechanically fracture or split the workpiece 206 along the layer of microbubbles 301. The remaining workpiece 206 that is split off may be reused in some embodiments. The workpiece 206 may require polishing in one instance. In some instances, no handle 303 is used and the part of the workpiece 206 that is split is self-supporting.

In one particular embodiment, ion beams of different dimensions are used for the first species 300 and second species 302. A ribbon beam with a larger height may be used for the first species 300 compared to the second species 302 to reduce beam current density. The beam height may be reduced for the second species 302. In one instance, the ion beam for the first species 300 is four times as wide as the ion beam for the second species 302.

Figure 4:
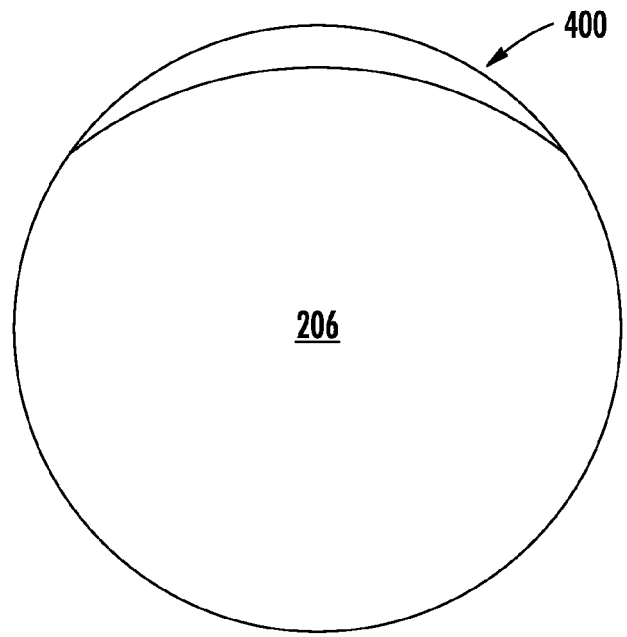
FIG. 4 is a top perspective view of a first embodiment of an implanted workpiece.
Figure 5:
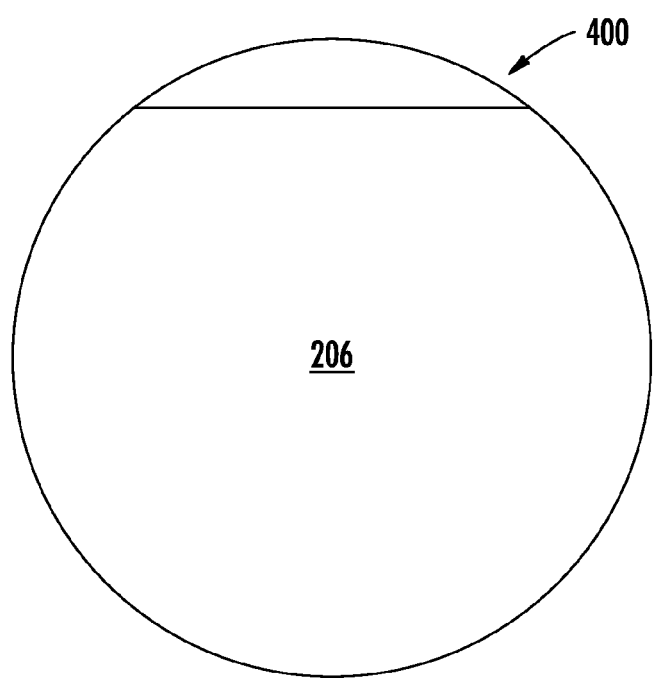
FIG. 5 is a top perspective view of a second embodiment of an implanted workpiece.

FIG. 4 is a top perspective view of a first embodiment of an implanted workpiece. While the entire workpiece 206 is implanted with a second species, the workpiece 206 has a portion 400 of the periphery that has a higher dose of the second species. In the embodiment of FIG. 4, the portion 400 has an arcuate or curved shape. In one instance, the portion 400 is approximately 10 mm measured from the periphery to the center of the workpiece 206. The portion 400 may have an approximately 20% higher dose of the second species than the remainder of the workpiece 206. FIG. 5 is a top perspective view of a second embodiment of an implanted workpiece. The portion 400 in the embodiment of FIG. 5 extends to a linear edge. In the embodiments of FIGS. 4-5, the split of the workpiece 206 initiates at the portion 400 at least partly due to the higher dose. Of course, other implant patterns are possible besides those illustrated in FIGS. 4-5. The embodiments of FIGS. 4-5 are merely examples.

The embodiments disclosed herein are improvements over, for example, implanting the entire workpiece or entire periphery of a workpiece with an increased dose. By only having a portion of the periphery with a higher dose, the split is initiated at a particular point. Otherwise, the split initiates at a random point in the workpiece. For thermal splitting methods, the portion 400 of the workpiece 206 may be positioned on a rack or assembly pointed at the top of the thermal processing unit, which may be a furnace. The top of the thermal processing unit may have the highest temperature. Therefore, positioning the portion 400 here enables a ripening process for the microbubbles and subjects the portion 400 to the largest thermal or mechanical stress. The temperature gradient in the thermal processing unit and the region where the portion 400 is located may be optimized. Furthermore, if a mechanical splitting method is used then the location where to apply mechanical force corresponds to the portion 400 of the periphery with a higher dose.

The split also may be optimized using the portion 400 to enable split propagation across the workpiece 206. The increased dose in the portion 400 reduces tearing during propagation of the split. The dose to initiate and propagate the split may be different. In one mechanism, the addition of the second species to the first species makes a split easier to initiate, though other mechanisms are possible. By reducing tearing, surface roughness may be improved.

Splitting may occur at the hottest part of a thermal processing unit in one embodiment. This thermal processing unit, which may be a furnace, may have a thermal gradient to initiate and propagate a split in the workpiece 206. The portion 400 of the workpiece 206 with the increased dose may be positioned such that the portion 400 is disposed in this hottest part of the thermal processing unit. Such placement reduces damage to the part of the workpiece 206 not subjected to the highest temperature. In one potential mechanism, the highest temperature usually modifies the structure of the microbubbles, coarsening the structure through Ostwald ripening. Ostwald ripening is a thermodynamic process where larger particles grow by drawing material from smaller particles because larger particles are more stable than smaller particles. The addition of the second species with the first species may reduce this coarsening. The higher dose in the portion 400 may further reduce damage caused by temperature.

Figure 6:
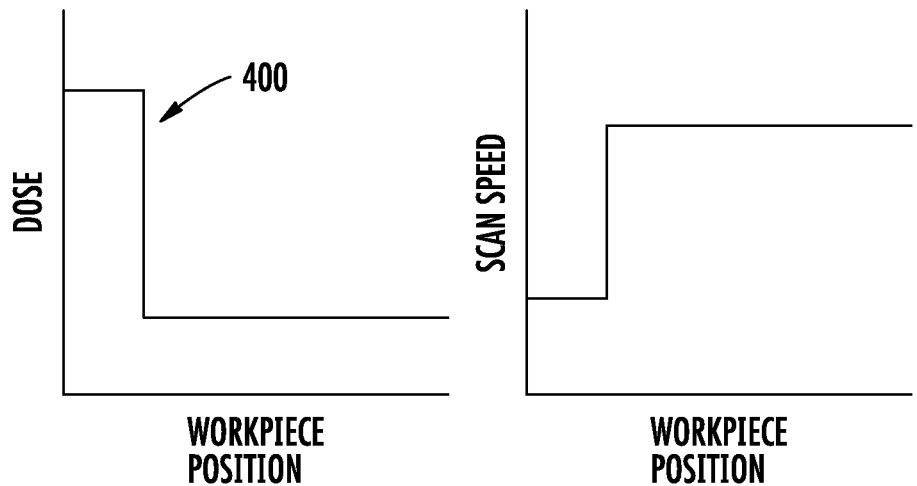
FIGS. 6-7 are charts illustrating formation of a non-uniform dose.
Figure 7:
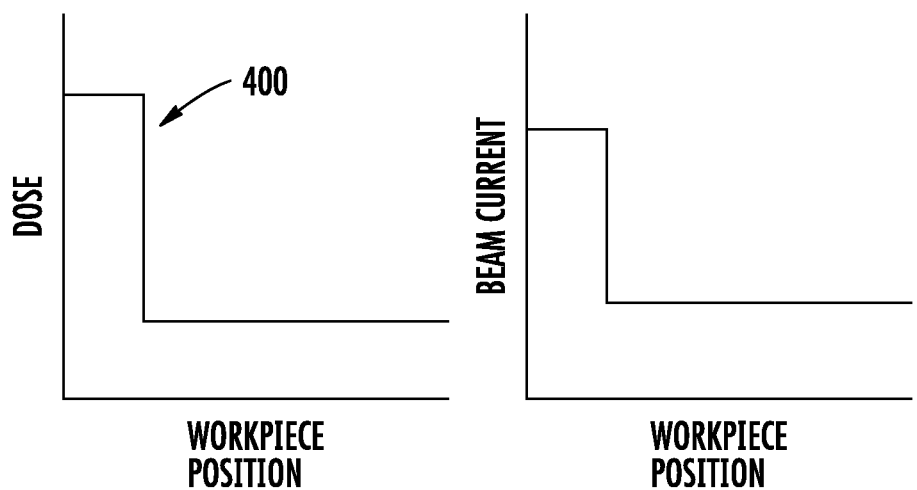

FIGS. 6-7 are charts illustrating formation of a non-uniform dose. FIG. 6 illustrates changing the scan speed to form a non-uniform dose. Scan speed may refer to scanning the ion beam, scanning the workpiece, or a combination of both. FIG. 7 illustrates changing the beam current to form a non-uniform dose. In both FIG. 6 and FIG. 7, the workpiece positions correspond between each set of charts and the region of higher dose corresponds to the portion 400 of FIGS. 4-5. Of course, both the scan speed of the workpiece and beam current may be changed concurrently to form a non-uniform dose. In both the embodiments of FIG. 6 and FIG. 7, one pass or multiple passes of the workpiece with the ion beam may be used to form the portion 400 illustrated in FIGS. 4-5.

By changing the scan speed or beam current, a non-uniform dose may be formed corresponding to a two-dimensional map. The two-dimensional map may vary depending on the workpiece being implanted. Furthermore, the beam may only have to be retuned between the first species and second species. This increases throughput of the implanter.

In an alternate embodiment, both the first species 300 and second species 302 of FIG. 3 have non-uniform doses. This is accomplished by, for example, altering a scan speed of the workpiece 206 or an ion beam current of the first species 300 and second species 302. Thus, the dose of the first species 300 and second species 302 is not the same across the entire implanted surface of the workpiece 206. In one embodiment, the non-uniform dose of the first species 300 and the second species 302 is approximately the same. Both the first species 300 and second species 302 may have a higher dose at a portion 400 of the periphery of the workpiece 206.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to all within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting a workpiece comprising:
    implanting a first species into an entire surface of said workpiece, wherein said first species has a dose that is uniform across said entire surface of said workpiece;
    implanting helium into said entire surface of said workpiece, wherein said helium has a non-uniform dose such that said helium has a higher dose at a portion of a periphery of said workpiece; and
    initiating a split of said workpiece at said portion of said periphery with said higher dose.

2. The method of claim 1, wherein the first species is selected from the group consisting of hydrogen, helium, and nitrogen.

3. The method of claim 1, wherein said portion is less than 360° of said periphery of said workpiece.

4. The method of claim 1, wherein said initiating uses at least one of a thermal process or a mechanical process.

5. The method of claim 1, wherein said non-uniform dose is caused by altering at least one of a scan speed of said workpiece and an ion beam current of said helium.

6. The method of claim 1, wherein said portion of said periphery has a dose of said helium at least 20% larger than a remainder of said workpiece.

7. The method of claim 1, wherein said implanting said first species and said implanting said helium are performed sequentially without breaking a vacuum.

8. A method of implanting a workpiece comprising:
    implanting a uniform dose of hydrogen into said workpiece;
    implanting a non-uniform dose of helium into said workpiece by altering at least one of a scan speed of said workpiece and an ion beam current of said helium, wherein said helium has a higher dose at a portion of a periphery of said workpiece; and
    initiating a split of said workpiece at said portion of said periphery with said higher dose.

9. The method of claim 8, wherein said portion is less than 360° of said periphery of said workpiece.

10. The method of claim 8, wherein said initiating uses at least one of a thermal process or a mechanical process.

11. The method of claim 8, wherein said portion of said periphery has a dose of said helium at least 20% larger than a remainder of said workpiece.

12. The method of claim 8, wherein said implanting said hydrogen and said implanting said helium are performed sequentially without breaking a vacuum.

13. A method of implanting a workpiece comprising:
    implanting a uniform dose of hydrogen into said workpiece;
    implanting a non-uniform dose of helium into said workpiece by altering at least one of a scan speed of said workpiece and an ion beam current of said helium, wherein said helium has a higher dose at a portion of a periphery of said workpiece and wherein said non-uniform dose of said helium is larger than said uniform dose of said hydrogen; and initiating a split of said workpiece at said portion of said periphery with said higher dose.

14. The method of claim 13, wherein said portion is less than 360° of said periphery of said workpiece.

15. The method of claim 13, wherein said initiating uses at least one of a thermal process or a mechanical process.

16. The method of claim 13, wherein said portion of said periphery has a dose of said helium at least 20% larger than a remainder of said workpiece.

17. The method of claim 13, wherein said implanting said hydrogen and said implanting said helium are performed sequentially without breaking a vacuum.

* * * * *